United States Patent [19]
Piccone et al.

[11] Patent Number: 5,670,383
[45] Date of Patent: Sep. 23, 1997

[54] METHOD FOR FABRICATION OF DEEP-DIFFUSED AVALANCHE PHOTODIODE

[75] Inventors: Dante Edmond Piccone, Glenmoore, Pa.; Ahmad Nadeem Ishaque, Clifton Park, N.Y.; Donald Earl Castleberry; Henri Max Rougeot, both of Schenectady, N.Y.; Peter Menditto, Westerlo, N.Y.

[73] Assignee: General Electric Company, Schenectady, N.Y.

[21] Appl. No.: 440,811

[22] Filed: May 15, 1995

Related U.S. Application Data

[62] Division of Ser. No. 223,397, Apr. 4, 1994, Pat. No. 5,446,308.

[51] Int. Cl.[6] .................................................. H01L 31/18
[52] U.S. Cl. ........................... 437/3; 437/974; 437/20
[58] Field of Search ........................ 437/2, 3, 5, 20, 437/23, 974, 153, 154, 958; 148/DIG. 145

[56] References Cited

U.S. PATENT DOCUMENTS

| | | | |
|---|---|---|---|
| 3,886,579 | 5/1975 | Ohuchi et al. | 357/13 |
| 4,142,200 | 2/1979 | Mizushima et al. | 357/30 |
| 4,458,260 | 7/1984 | McIntyre et al. | 357/30 |
| 4,761,383 | 8/1988 | Matsushima et al. | 437/3 |
| 4,840,916 | 6/1989 | Yasuda | 437/3 |
| 4,876,209 | 10/1989 | Forrest | 437/5 |
| 4,968,634 | 11/1990 | Kuhlmann | 437/3 |
| 5,021,854 | 6/1991 | Huth | 357/30 |
| 5,049,962 | 9/1991 | Huang et al. | 357/30 |
| 5,098,851 | 3/1992 | Ito et al. | 437/5 |
| 5,343,055 | 8/1994 | Davis et al. | 257/186 |
| 5,500,376 | 3/1996 | Ishaque et al. | 437/3 |

FOREIGN PATENT DOCUMENTS

| | | | |
|---|---|---|---|
| 57-60876 | 4/1982 | Japan. | |
| 6428969 | 1/1989 | Japan. | |
| 2090575 | 3/1990 | Japan. | |
| 2253666 | 10/1990 | Japan. | |
| 2-248081A | 10/1990 | Japan | 437/3 |
| 3297173 | 12/1991 | Japan. | |
| 1215557 | 12/1970 | United Kingdom. | |

OTHER PUBLICATIONS

V.L. Gelezunas et al., "Uniform Large-Area High-Gain Silicon Avalanche Radiation Detectors From Transmutation doped Silicon," American Institute of Physics, 1977, pp. 118–120.

Sze, S.M., "Physics of Semiconductor Devices," John Wiley, New York, 1981, pp. 783–787.

*Primary Examiner*—John Niebling
*Assistant Examiner*—S. Mulpuri
*Attorney, Agent, or Firm*—Donald S. Ingraham

[57] ABSTRACT

A method of forming a planar semiconductor device, such as an array of APDs, includes the steps of doping a substantially planar block of n type semiconductor material with a p type dopant in accordance with a selected pattern to form a plurality of n type wells in the block surrounded by a foundation of p type semiconductor material. Each n type well is disposed so as to respectively adjoin a first surface of the block and such that a respective p-n junction is formed between the n type material in the well and the p type material foundation. The n type semiconductor material in each well has a substantially constant concentration of n type dopant throughout the n type material; the concentration of p type dopant in the foundation has a positive gradient extending from the p-n junction towards the second surface such that the peak surface electric field of the p-n junction in each well is less than the bulk electric field of the same p-n junction.

21 Claims, 3 Drawing Sheets

METHOD FOR FABRICATION OF DEEP-DIFFUSED AVALANCHE PHOTODIODE

This application is a division of application Ser. No. 08/223,397, filed Apr. 4, 1994 U.S. Pat. No. 5,446,308.

BACKGROUND OF THE INVENTION

Devices used in radiation imaging for medical purposes or the like must be able to detect low levels of incident optical photons or ionizing particles to minimize patient exposure to radiation. In such imaging devices it is often advantageous to employ radiation detection devices having internal gain; avalanche photodiodes (APDs) are commonly used in such devices to provide the desired detection sensitivity. An APD is a semiconductor device that is biased near the breakdown region such that charge generated as a result of the absorption of an incident photon is amplified in the APD itself as a result of a cascading effect as charge is accelerated by the high bias potential applied across the p-n junction of the device. In such imaging devices, it is desirable that the APD exhibit low noise and high gain. Certain devices, such as medical imagers (e.g., using gamma radiation), also require relatively large arrays (e.g., about 5 cm$^2$ or larger) of high quality, low noise APDs.

Currently, the two types of APD designs in common use are the "deep diffused" structure and the "reach through" structure. Deep diffused APDs exhibit a wide avalanche region and operate at a relatively small electric field, resulting in a small value of the device parameter "k" (which determines excess noise), large gain, and stable device operation.

Deep diffused APDs, however, are typically not readily manufactured in large arrays as each device must be formed to have a precise bevel at the edge of the device. The bevel is required to reduce the peak surface field (i.e., the electric field across the p-n junction in the area where the p-n junction intersects the surface of the structure) of the APD well below the peak bulk electric field (i.e., the electric field across the p-n junction in the body of the device where the p-n junction is disposed substantially parallel to the surfaces of the device to which the bias is applied) so that the APD breaks down in the bulk instead of at the surface. For example, the peak surface field should have a value about 70% or less than the value of the bulk field to ensure the APD breaks down in the bulk (breakdown outside of the bulk results in significantly more device noise).

Bevel formation requires mechanical operations which make the fabrication process non-standard in that the bevel for each device must be individually formed. The non-standard methods required for bevel formation also results in reduced yield and non-uniform reliability of the devices formed, making the fabrication of large area arrays of this type of device expensive and difficult. Furthermore, the beveled edge procedure is difficult to extend to monolithic arrays because of the lack of a suitable isolation technique between adjacent devices on a chip.

Deep diffused APDs are typically fabricated by diffusing a p type dopant, such as gallium, into a wafer of n type material from both sides of the wafer, resulting in two parallel p-n junctions in the wafer. The p doped material on one side of the wafer is completely removed so that only one p-n junction remains in the wafer. The remaining p and n regions are thinned to appropriate dimensions and p+ and n+ diffusions are made to respective sides of the wafer to form contact pad to the p and n doped sections respectively. Discrete devices are then diced from the wafer, and the edges are beveled as described above to obtain the desired surface field characteristics for good reverse blocking capability. The mechanical cutting and finishing (such as by etching) of the bevels renders an array of such devices mechanically fragile. As noted above, such a process is time consuming and requires a high degree of precision to form the appropriate bevels, and such a structure requires a careful passivation to minimize the injection of charge from the beveled portion of the device.

Variations of this technique, in which shallow grooves are cut that extend close to, but not into, the depletion area of the device, have also been tried. Isolation in such a device is a function of lateral inter-pixel resistance as compared to the input resistance of the readout circuit; because the depletion layer changes dependent upon applied voltage, isolation in this type of device is obtained only for a very narrow range of applied bias voltage. Further, even in this narrow range of voltage, a small input resistance is needed in the readout circuit to provide adequate isolation. The Johnson noise from this resistance, because of its small value, typically introduces unacceptable noise levels in the preamplifier and is unacceptable for medical imaging devices.

The reach through APD structure generally does not require bevel formation. The reach through type of APD typically has a shallow p-n junction that results in lower gain, a larger value of k (resulting in high noise devices), and greater temperature drift than deep diffused devices. Further, the active area of reach through devices is small as compared to deep diffused devices. Array fabrication can be accomplished, although the process is time consuming and expensive as many steps are required to fabricate the array, and the resulting APDs in the array suffer the drawbacks noted above. Arrays in reach-through technology are also limited to a small active area.

For most imager devices, it is thus desirable to have an APD array that is readily fabricated and that contains high quality individual APD pixels, that is APDs that exhibit low noise and high gain. It is also desirable that the array be structurally strong.

It is an object of this invention to provide a deep-diffused planar APD array that is structurally strong, readily fabricated, does not require bevel formation or a junction termination technique, and that comprises APDs that exhibit low noise and high gain.

It is a further object of this invention to provide a method of fabricating a planar discrete APD structure comprising high quality APDs.

SUMMARY OF THE INVENTION

A planar deep-diffused semiconductor device, such as an array of avalanche photodiodes (APDs), includes a plurality of n type semiconductor material wells extending inward from a first surface of the device, and a foundation comprising p type semiconductor material disposed around each of the n type wells such that a p-n junction is formed between the two types of semiconductor material. The foundation of p type material further comprises a portion of the first surface that surrounds each respective n type well such that each well is electrically isolated from adjoining wells; the p type material foundation also comprises the second surface of the device, the second surface being disposed substantially opposite the first surface. The n type semiconductor material in each well has a substantially constant concentration of n type dopant throughout the n type material; the concentration of p type dopant in the foundation has a positive gradient extending from the p-n junction towards the second surface such that the p type doping concentration exceeds the n type doping concentration as the second surface is approached. In this arrangement, upon the application of breakdown potential across the p-n junction, the device electrically breaks down in the area of the parallel-plane bulk electric field before breaking down in the area of the surface electric field or in the area of electric field where the p-n junction is arcuate in shape. The n type semiconductor material typically comprises neutron transmutation doped silicon and the p type dopant is typically gallium; alternatively, boron, aluminum, or the like can be used.

The p-n junction surrounding each of said wells typically comprises a parallel segment that is disposed substantially parallel to the second surface of the device and is the portion of the p-n junction across which the bulk electric field is determined. Each well is shaped so that the p-n junction further comprises an arcuate-shaped oblique segment extending between each respective parallel segment and the first surface of the device such that the p-n junction intersects the first surface at an acute angle (as measured from the interior of the well) that is advantageously less than about 60°, giving rise to a peak surface field that is less than about 60% of the peak bulk field. Each well is further disposed such that the curvature of respective oblique segments of the p-n junction is centered inside the n type material well; alternatively, the arcuate portion of the junction is deeper diffused than the parallel segment; or both of the foregoing conditions are met.

A method of forming a planar semiconductor device, such as an array of APDs, includes the steps of doping a substantially planar block of n type semiconductor material with a p type dopant in accordance with a selected deep doping pattern to form a plurality of n type wells in the block surrounded by a foundation of p type semiconductor material. Each n type well is disposed so as to respectively adjoin a first surface of the block and such that a respective p-n junction is formed between the n type material in the well and the p type material foundation. Doping the block with p type material includes the step of doping the block to form a positive gradient of the p type dopant between each respective p-n junction and a second surface of the device, the second surface being disposed substantially opposite to the first surface. Typically a p type dopant such as gallium, boron, aluminum, or the like, is diffused into a neutron transmutation doped block of silicon.

The step of doping the block in accordance with a selected deep doping pattern further includes the steps of differentially doping the block with a p type dopant such the p-n junction surrounding each of the n type wells has a selected junction profile comprising a parallel segment that is disposed substantially parallel to the second surface and oblique segments disposed between the parallel segment of each respective p-n junction and the first surface of the block such that the p-n junction intersects the first surface at a selected angle and such that the curvature of the arcuate shaped portion of the oblique segment is centered inside the n type well, is deeper diffused than the planar junction, or both. After doping with the p type dopant, portions of the first and second surfaces of the block are removed such that the the n type wells are electrically isolated from adjacent wells by intervening portions of p type doped material on the remaining first surface of the block. Portions of the second surface of the block are removed to provide a selected distance between the remaining second surface and the parallel segments of respective n type wells.

Various methods can be used to accomplish the differential doping with p type dopant of the n type semiconductor material block, including forming grooves in the second surface of the block in accordance with the deep doping pattern, the deep doping pattern corresponding to the pattern of p type material separating respective n type wells on the first surface of the finished array device. Alternatively, a mask having a pattern corresponding to the deep doping pattern can be applied to the second surface of the block, a diffusion of p type material performed, the mask removed, and a second diffusion performed across the entire surface to provide a desired doping profile. In another embodiment, a combination of grooving and masking can be used. In a further embodiment, a first p type dopant is implanted on the second surface of the block in accordance with the selected deep doping pattern and a second p type dopant is diffused into the block thereafter so as to provide the desired doping profile.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

A deep diffused semiconductor device planar array having isolation on the n side of the army is formed in accordance with this invention as set out below. "Deep diffused," as used herein, refers to devices in which a desired dopant has been introduced into a block of semiconductor material to alter its doping profile and to establish a desired p-n junction profile at a substantial depth from the surface, such as greater than 100 μm. As used herein, "planar" refers to a device structure having two opposing surfaces that are substantially parallel to one another, "planar" as used in the context of the fabrication process further refers to treatment of the device to form the desired p-n junction profile in which the fabrication processes are performed at one or both of the two respective surfaces, without the need for separate fabrication processes to treat the sides of the individual devices in the array or the edge of the array itself. "Isolation on the n side of the array", as used herein, refers to a semiconductor device comprising a surface having contacts to wells of n type material on that surface. The respective wells of n type material are separated electrically from one another at this surface by intervening areas of p type material. The method of this invention is particularly well adapted to the formation of avalanche photodiode (APD) devices; additionally, power semiconductor devices such as power rectifiers and inverters can be readily formed in accordance with this invention.

Figure 1A:
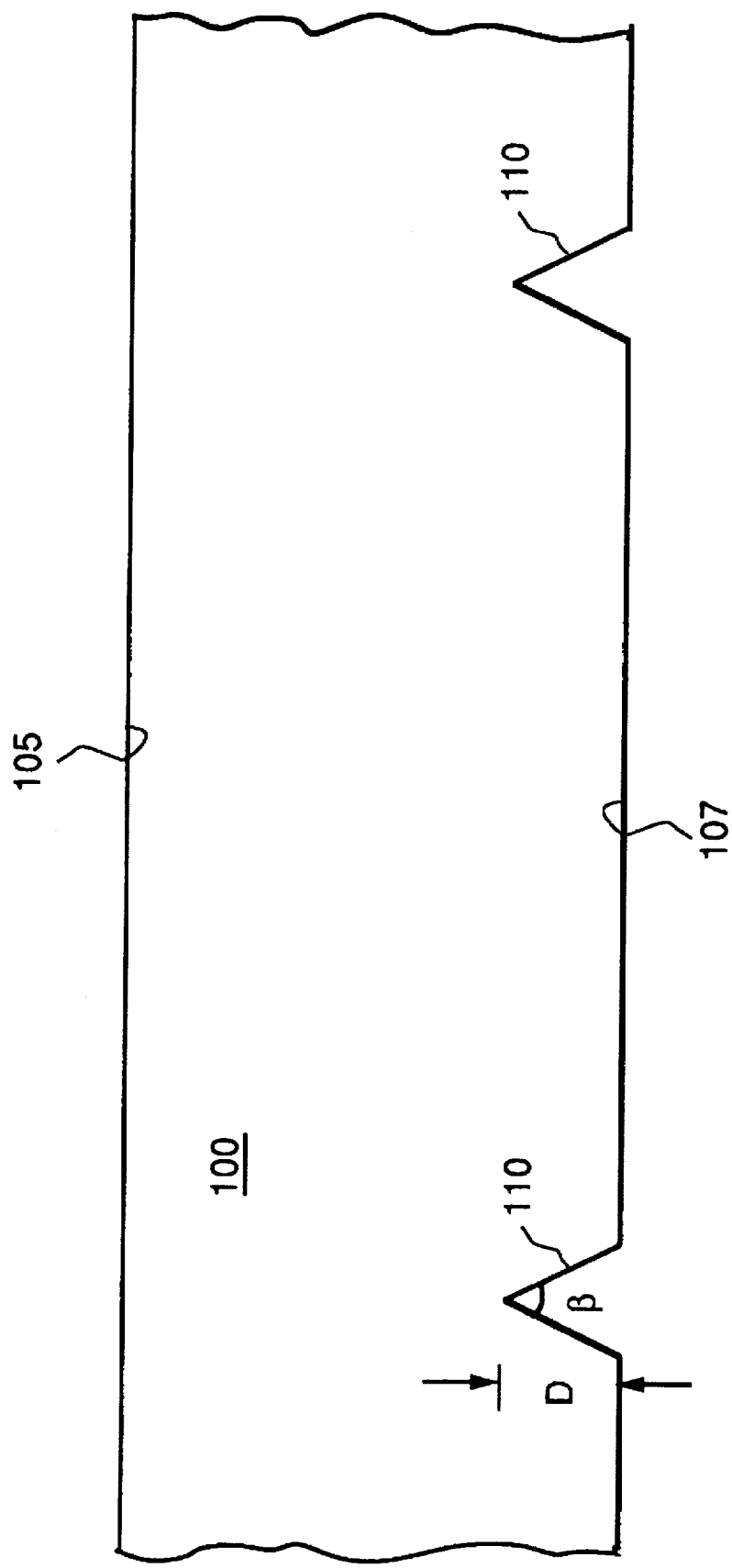
FIGS. 1 (A)–1(C) are cross sectional views of an avalanche photodiode array at three successive steps during the fabrication process in accordance with this invention.

FIGS. 1 (A)–1(C) illustrate the fabrication of a planar deep diffused avalanche photodiode (APD) array in accordance with one embodiment of the present invention. A block of n type semiconductor material 100 having a first surface 105 and a second surface 107 that are disposed opposite one another and that are substantially parallel to one another. "Substantially parallel" refers to surfaces that lie in planes that are within a range of about plus or minus 2° of being parallel to one another. "N type semiconductor material" or the like refers to semiconductor material that is doped so that it exhibits n type conductivity, that is, electrons comprise the majority carrier and the holes in the material comprise the minority carrier (similarly, "p type semiconductor material" or the like refers to semiconductor material in which holes comprise the majority carrier and electrons comprise the minority carrier). In accordance with this invention, the n type semiconductor material comprising block 100 has a constant concentration of n type dopant throughout the block, that is, the block is uniformly doped. Block 100 typically comprises neutron transmutation doped silicon; the neutron transmutation doping process provides a substantially uniform n type doping level throughout block 100. The thickness of block 100 (that is, the distance between first and second surfaces 105, 107) is typically in the range between about 400 µm and 1500 µm.

Grooves 110 are formed in second surface 107 of block 100 in accordance with a selected deep doping pattern. The deep doping pattern corresponds to areas of block 100 in which it is desired that p type dopant penetrate more deeply so as to form the desired arrangement of p type material and n type material as described below. Typically, the deep doping pattern is substantially in the shape of an orthogonal grid.

Figure 1B:
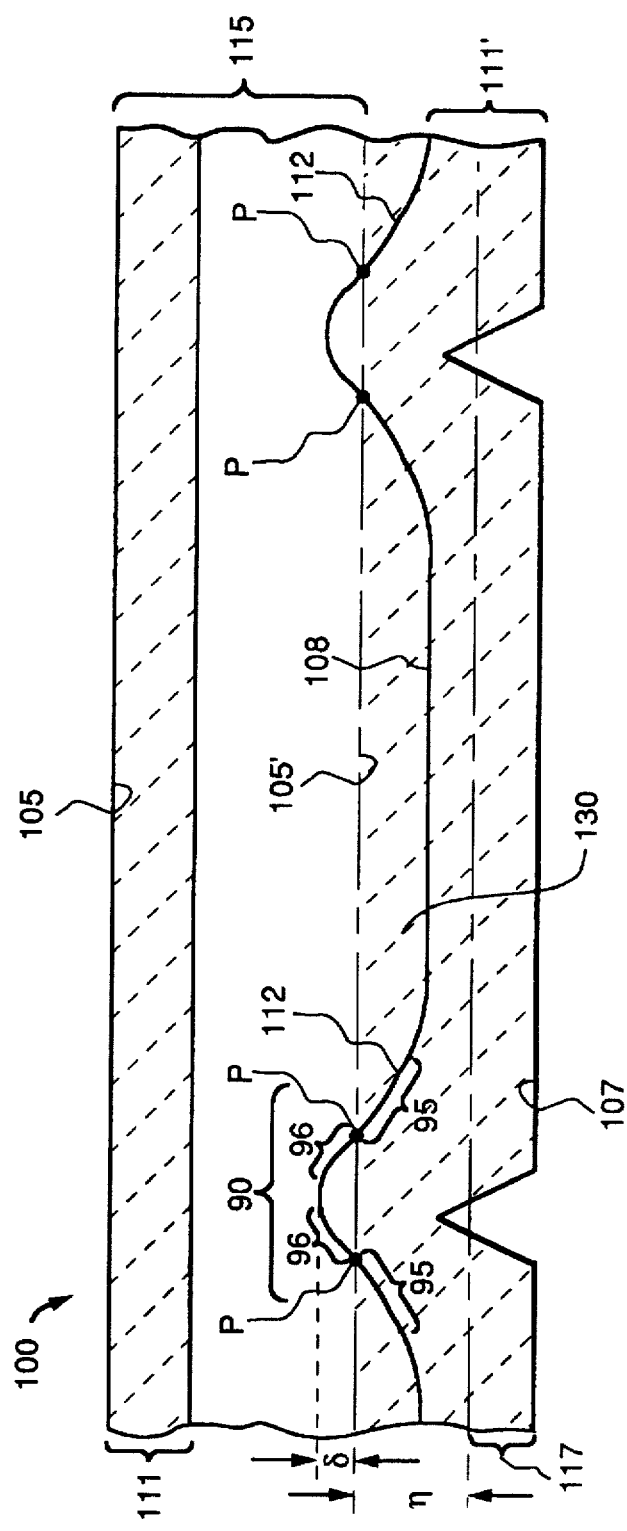

Grooves 110 are typically formed by mechanically cutting; alternatively, etching or the similar procedures can be used. Grooves 110 typically are V-shaped, as illustrated in FIG. 1 (A), but alternatively can comprise vertical sidewalls (square or rectangular shaped) or curved sidewalls (semicircular or elliptical shaped). For a typical V-shaped groove as illustrated in FIG. 1 (A), groove depth "D" is typically about 200 µm, and can be in the range between about 50 µm and 400 µm; groove depth is selected to provide a desired p type doping profile in block 100, as described more fully below, to form wells of n type material of a desired depth that are surrounded by p type material. Groove depth "D" is thus determined by summing the desired thickness of the well "η" and a value "δ" (FIG. 1(B)) that will provide a desired separation between respective first surface portions of the n type wells in the finished devices. The value of "η" is chosen such that the full depletion layer can be supported at the breakdown voltage. Groove angle "β" is also selected to provide a desired p type doping profile and typically is in the range between about 60° and 120°.

Block 100 is next doped with a p type dopant such as gallium (Ga); alternatively, p type dopants such as boron (B), aluminum (Al), or the like, can be used. For example, block 100 is typically doped with Ga in a deep diffusion process in which block 100 (commonly multiple blocks are processed at one time) is sealed in a chamber with a gallium source and exposed to temperatures in the range of 1200° C. to 1270° C. under conditions known in the semiconductor processing art so as to drive the Ga dopant into the n type material of block 100; the depth of the Ga penetration across a planar surface is controlled primarily through the duration of the deep diffusion process. The Ga dopant is thus driven into block 100 to form p type material doped portions 111, 111' in block 100 (illustrated with broad cross-hatch in FIG. 1(B)). The depth of the penetration of the Ga is substantially a uniform distance from the respective first and second surfaces 105, 107 through which the dopant was driven into the planar block 100. Further, the diffusion doping process provides a positive dopant concentration gradient, that is the concentration of the p type dopant is less closer to the p-n junction and increases towards second surface 107. Thus, the concentration of p type dopant at second surface 107 is greater than the concentration of p type dopant at an interior boundary 108 of p type material doped portions 111 '. Typically, the concentration of p type dopant at second surface 107 is in the range between about $10^{15}$ atoms/cm$^3$ and $10^{20}$ atoms/cm$^3$. The concentration profile typically corresponds to a complementary error function distribution or a Gaussian distribution.

The doping profile, that is, the boundaries of doped portions 111 and 111', also represents the p-n junction formed between the remaining n type material of block 100 and the portions of block 100 now doped to exhibit p type conductivity. A p-n junction 112 between p type material doped portion 111' and the adjoining n type material has a profile that corresponds to the pattern of grooves 110 formed in second surface 107. The profile of p-n junction 112 has an undulatory shape that corresponds to portions of block 100 in which the p type dopant of doped portion 111' has penetrated further into the block (that is, the doped area extends closer to first surface 105). An undulatory portion 90 of p-n junction 112 further has a point of inflection "P" (FIG. 1(B)); between inflection point P and second surface 107 is a first section 95 in which the p-n junction is arcuate-shaped with a curvature of the arc (which is not necessarily constant) such that the center of the arc is in the n type-material portion of block 100 (that is, the shape of the p-n junction is concave with respect to the p type material side 111' of the junction). Between inflection point P and the point of furthermost penetration of undulatory portion 90 into block 100 is a second section 96 in which the p-n junction is arcuate-shaped but with a curvature (which is not necessarily constant) such that the center of the arc is in the p type doped portion 111' (that is, the shape of the p-n junction is convex with respect to the p type material side 111' of the p-n junction.

Next, a first planar portion 115 is removed from block 100; removal of this portion of block 100 leaves a remaining first surface which for purposes of illustration in FIG. 1(B) is designated by numeral 105' and is represented by a dashed line (subsequent to the removal of block portion 115, first surface 105 refers to that respective remaining surface of the block. First planar portion 115 is removed such that the remaining first surface 105 comprises a plurality of n type material wells 130 separated on remaining first surface 105' by exposed portions of p type material of p type material doped portion 111'. The amount of material removed to form remaining first surface 105' (that is, the amount of first planar portion 115) is typically selected such that remaining first surface 105' is disposed across the respective points of inflection P or below the respective points of inflection (that is, between the points in the respective first sections 95 of each undulatory portion 90 formed in the block). Removal of at least the material comprising the p-n junction in the respective second sections of each undulatory portion 90 leaves a remaining undulatory portion of p-n junction 112 that is arcuate shaped and is everywhere curved in such a manner that the center of the arc lies within the n type material of the block. As a result of this arrangement, in the finished device, as described more fully below, the electric field over the respective remaining undulatory portions 90 of p-n junction 112 is smaller than the bulk electric field that exists across respective parallel-plane portions of p-n junction 112. If large enough portions of respective second sections of undulatory portions 90 were left in the finished device, the electric field across these sections could be large enough to precipitate a breakdown at a voltage below the breakdown voltage across the respective parallel-plane portions of the p-n junction.

Figure 1C:
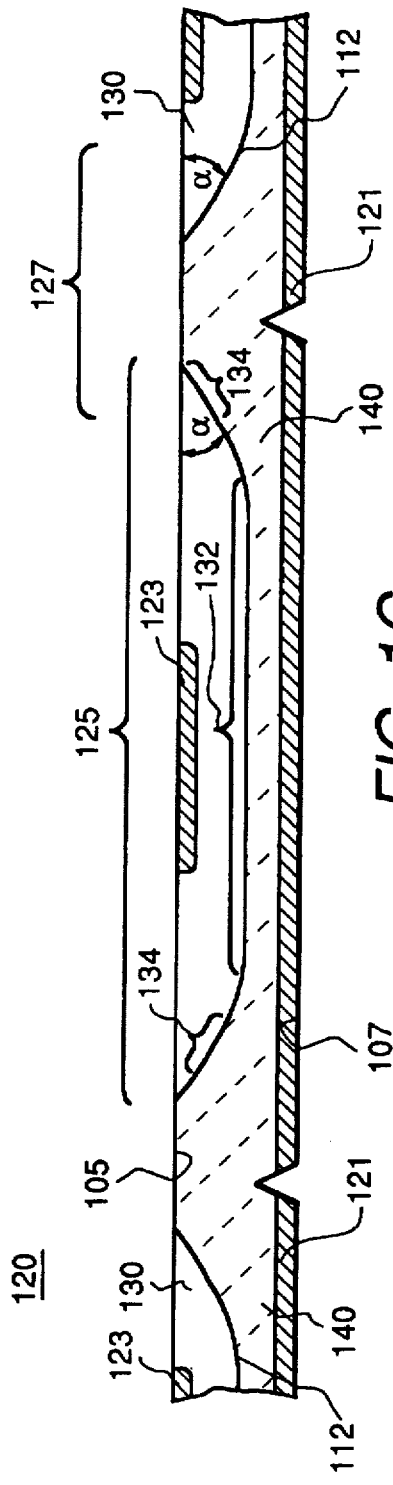

Typically the next step in the fabrication of an APD array in accordance with this invention comprises the application of n type dopant to the portions of the exposed n type material of respective wells 130 on remaining first surface 105' to form an n+ contact layer 123 for each respective well 130 (illustrated in FIG 1(C)). The n type dopant used to dope a portion of well 130 to form contact layer 123 is typically phosphorous, and is typically applied in a POCl$_3$ process to form n+ contact layer 123 having a thickness in the range between about 5 µm and 15 µm. N+ contact layer 123 typically extends over less than about 10% of the first surface 105 area of well 130.

A second planar portion 117 (FIG. 1(B)) is then removed from block 100; removal of this portion of block 100 leaves a remaining second surface which for purposes of illustration in FIG. 1(B) is designated by numeral 107' and is represented by a dashed line (subsequent to the removal of block portion 117, second surface 107 refers to the respective remaining surface of the block). Second planar portion 117 is removed so as to leave a selected distance between the lower extent of each n type well 130 and the remaining second surface 107'.

First and second planar portions 115, 117 are typically respectively removed by a combination of a mechanical process such as lapping or grinding and an etching process of block 100 to remove the desired amount of material. For example, a mechanical process such as lapping or grinding is typically used to strip away all but about 30 µm to 60 µm of the block material to be removed; the remaining 30 µm to 60 µm of silicon is removed in a polishing etch process to create a remaining first surface 105' and remaining second surface 107' that have a good finish and are substantially damage free so as to reduce leakage current at the surface.

In the fabrication of an APD array, p type dopant is applied to second surface 107 to form a p+ contact layer 121 (FIG. 1(C) across the face of second surface 107. The p type dopant is typically boron or alternatively a combination of boron and gallium and is applied in a diffusion, or alternatively, an implantation, process to form p+ contact layer 121 having a thickness in the range between about 0.5 µm and 7 µm. The thickness of contact layer 121 is chosen both to provide a contact pad to the individual APD pixel and to provide a desired short wavelength quantum efficiency for the APD pixel. In particular, the doping profile (e.g., the thickness of the layer) of contact layer 121 is selected to provide an electric field at and in the vicinity of second surface 107 (FIG. 1(C)) such that a charge carrier generated by incoming radiation absorbed near surface 107 is pumped into the body of the APD pixel (that is, towards well 130) before the charge is lost through surface recombination. Typically short wavelength radiation is absorbed near the surface and the presence of p+contact layer 121 of an appropriate thickness increases the sensitivity of the APD to short wavelength radiation.

Following completion of the fabrication steps noted above, a planar array 120, configured as illustrated in FIG. 1(C), remains. Planar array comprises a plurality of n type wells 130 disposed in a foundation 140 of p type material, with p-n junction 112 comprising the boundary between the two types of doped material. By reason of the steps of the process set out above, the concentration of dopant in the n type material comprising each well 130 is substantially constant (being a portion of the original neutron transmutation doped block 100) and the gradient of concentration of p type dopant in foundation 140 is positive, that is the concentration of p type dopant increases as the second surface 107 is approached. Each well 130 is electrically isolated from adjacent wells 130 by intervening portions of foundation 140 comprising p type material such that a plurality of respective pixels 125 are formed in planar array 120, each pixel 125 comprising one well 130 and the associated foundation disposed between the well and second surface 107. Additionally, to reduce contact resistance on p+contact layer 121 (the light entrance window into the APD), typically a thin (e.g., 5 nm–300 nm thick) transparent conductor layer (not shown) is disposed on p+contact layer 121. Transparent conductor layer typically comprises indium tin oxide, tin oxide, indium oxide, or the like, and provides enhanced short time response (e.g., 10 pioseconds to 1 nanosecond) for fast event detection.

The p-n junction defining the boundary of each well comprises a parallel segment 132 and an arcuate-shaped oblique segment 134 extending between parallel segment 132 and first surface 105. The bulk electric field of each pixel 125 is determined across the respective parallel segment 132 of the respective p-n junction 112. The peripheral electric field of each pixel is determined by the electric field across respective arcuate-shaped oblique segments 134 of each respective p-n junction 112, and the surface electric field is determined at the intersection of oblique segment 134 and first surface 105. This profile of p-n junction, coupled with the uniform n type doping concentration in well 130 and the positive gradient of the p type dopant concentration in foundation 140 in each pixel results in desirable electrical performance of the pixel. In particular, the peak surface electric field (that is, the peak field along curved segment 134) is less than the bulk electric field, and typically is in range such that the peak surface field in a pixel is 70% or less of the bulk electric field of that pixel. Moreover, the peripheral electric field is also smaller than the bulk electric field. As a consequence, when a breakdown potential is applied across the junction, the device of the pixel breaks down in bulk, and not at the surface or along oblique segments 134; this characteristic provides a device that can be operated up to its full parallel plane breakdown voltage and thus improves device performance by providing high gain with low noise.

The value of the peak electric surface field is a function of the angle α made between oblique segment 134 of p-n junction 112 at its intersection with first surface 105. The value of angle α is typically less than about 60° in order to produce a device in which the peak electric surface field of 70% or less of the bulk electric field. In fabrication, the value of angle α determined by controlling angle β of V-shaped grooves 110 cut into block 100 (FIG 1(A)) because the profile of the diffused p type dopant will approximate the profile of the V-groove. Further, the depth D of the V-groove is used to control the thickness of the n type material in wells 130; a deeper V-groove results in p type dopant being diffused deeper into block 100 and thus allows thicker n type material wells 130 to be formed in the fabrication process when first planar portion 115 is removed (FIG. 1(B)).

Figure 2:
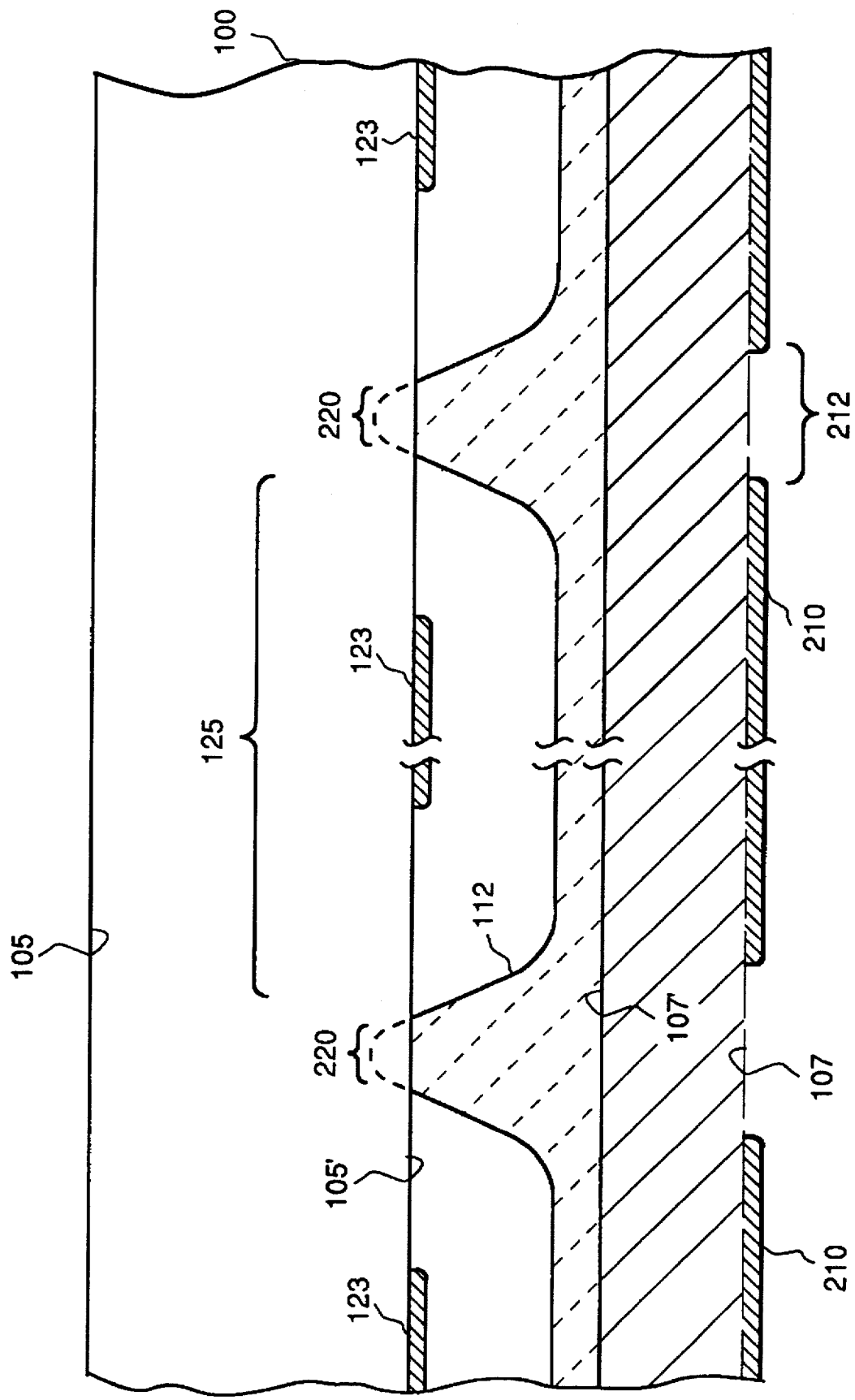
FIG. 2 is a cross sectional view of a avalanche photodiode array during fabrication in accordance with another embodiment of this invention.

For example, in a block 100 comprising neutron transmutation doped silicon having a resistivity of 30 ohms-cm and a thickness of about 600 µm, V-grooves 110 having a depth D of about 200 µm and an angle β of about 60°, with a Ga diffusion to about 120 µm, results in n type material wells having a thickness of about 160 µm and a p type material foundation disposed between the parallel segment of the well p-n junction and second surface 107 of about 40 µm. In this example, at the thinnest portion of the completed array, that is at the point where the V-groove penetrated farthest into block 100, about 80 µm of silicon remains, which provides adequate structural strength for the array for normal handling and operational procedures. Further, even though a relatively small part of the V-groove remains (after removal of second planar portion 117), as no electric field exists at second surface 107, the presence of such a groove does not adversely affect device performance. Alternatively, a completely planarized device (such as is illustrated in FIG. 2) can be obtained if the p type dopant is diffused deeply enough into block 100 so that, upon removal of second planar portion 117, groove 110 is completely removed.

Another element of array 120 (FIG. 1(C)) performance relates to the size of a dead space area 127 comprising the portion of array 120 between pixels 125 areas and the area underlying oblique segments 134 (FIG. 1 (C)) of the well in each pixel 125. Due to the small electric field across oblique segments of the p-n junction, little gain is generated in that region in response to an absorbed photon; it is thus desirable in devices used in medical imagers to minimize deadspace area 127 between pixels 125 (that is, the distance between respective parallel segments of the p-n junction is typically in the range between about 50 µm and 500 µm.

In accordance with this invention, the slope of the oblique segments 134 of respective well p-n junctions 112 is steepened by using thermal gradient diffusion to dope block 100. "Thermal gradient diffusion", as used herein, refers to a diffusion process in which diffusion is enhanced locally by localized heating. Thermal gradient diffusion allows for some selectivity of the lateral-to-forward diffusion rates of the process to produce, for example, a forward to lateral diffusion ratio as small as 10:1. Thermal diffusion techniques are well adapted for use both with a variety of groove shapes, such as square or rectangular shaped grooves, or alternatively in no-groove processes, in which the lateral-to-forward diffusion rates can effectively provide a desired doping profile and reduced dead space areas between pixels.

In accordance with another embodiment of this invention, the desired doping profile (that is, the profile to provide a p-n junction with parallel segments and oblique segments in the desired configuration to provide the desired bulk electric field, peripheral electric field, and surface electric field relationship described above) is produced using a method similar to that disclosed above except as noted below. In lieu of forming grooves in block 100, a mask 210 (FIG. 2) is applied to second surface 107 of block 100 of n type material. The pattern of the mask corresponds to a selected deep doping pattern to provide the desired p-n junction 112 profile, with unmasked areas on the second surface corresponding to the areas in which the deepest penetration of p type dopant into block 100 is to be obtained (these areas of deep penetration correspond to areas of p-type material 220 that will surround and electrically isolate respective wells 130 on remaining first surface 105' (portions of block 100 that are removed to form the completed device are illustrated. In FIG. 2 by dashed lines). This pattern similarly determines the size and arrangement of pixels 125 in the finished array. Mask 210 comprises silicon nitride or the like; for example, the silicon nitride is effectively impervious to the diffusion of Ga, and thus in a Ga diffusion the Ga is diffused into block 100 only through the windows 212 in mask 210.

A Ga diffusion process is applied to block 100 having mask 210 in place to effect a Ga diffusion to a selected depth, e.g., 180 µm. This step effectively determines the depth of the n type material wells 130 in the finished array. Because the depth of the n type material wells must be enough to support the depletion layer at full breakdown voltage, the depth of the first diffusion must be greater than the depletion layer width at full voltage. For example, for 30 Ω-cm starting n type material, the first diffusion depth should be at least 150 µm. Mask 210 is then removed, and a second Ga diffusion is applied to block 100; the diffusion in this latter process occurs uniformly across the surfaces of block 100 (e.g., second surface 107) exposed to the Ga diffusion; this uniform diffusion drives the Ga initially diffused through mask 210 further into block 100 so that the p-n junction 112 formed in block 100 has the desired profile, as illustrated in FIG. 2.

In the above-described method of fabrication, the arcuate-shaped oblique segments of p-n junction 112 are formed by two separate deep diffusion steps, and the parallel plane portion is formed by a single diffusion. Other factors being equal, a deeper diffused junction has a smaller electric field than a shallower junction (for example, a junction disposed closer to second surface 107). Therefore, provided the first diffusion is deeper than a selected value (e.g., 180 µm for a 30 Ω-cm n type starting material comprising block 100), the electric field in the oblique segment of the p-n junction would be less than the electric field in the parallel segment portion of p-n junction 112. In the device formed in accordance with this embodiment of the invention, therefore, the electric field in the entire oblique segment 134 of p-n junction 112 is smaller than the electric field in the parallel segment. Unlike the device illustrated in FIG. 1(C), the exact disposition of remaining surface 105 (after removal of a first planar portion of block 100) is not crucial in the device of FIG. 2 as the device of FIG. 2 will always first break down in the bulk region of parallel segment 132.

A further embodiment of this invention is similar to the masking embodiment described above with the exception that, in addition to applying the mask having a selected deep doping pattern, small grooves (e.g., 150 µm deep, which is smaller than the groove-only doping procedure described above) (not shown) are formed in the open areas of the mask through which the p type dopant is initially diffused into the block of n type material. The presence of the grooves enhances the penetration of the p type dopant in the selected deep penetration areas and thus reduces the time necessary to conduct the first application of p type dopant to achieve the desired penetration of the dopant into the block. In this embodiment, as in the embodiment depicted in FIG. 2, the electric field in the entire curved portion of the junction can be made smaller than the bulk electric field. As in the device of FIG. 2, the remaining first surface after removal of a first planar portion of the block of n type starting material, does not have to be located beyond the point of inflection of the undulatory shaped portion of the p-n junction to ensure bulk breakdown. The device can be made to breakdown in the bulk for any location of the first surface provided that the first diffusion is sufficiently deep (e.g., 160 µm). The presence of grooves, moreover, can reduce the total diffusion time for the first diffusion step by as much as 50%.

In a still further embodiment of this invention (not separately illustrated), the deep doping profile is obtained without using a mask. In this embodiment, grooves are formed in one surface of the silicon block and p type dopant is diffused across that surface, resulting in an undulatory deep doping profile (the deeper diffusion areas corresponding to respective grooves). The grooved surface is then lapped; this removal of the grooved portion of the block (and the adjoining diffused portion between respective grooves) produces a silicon block with diffused areas of p type dopant corresponding to where the grooves had been. Next, p type dopant is again diffused across the surface; this second diffusion results not only in a p type doped area extending in from the second surface of the silicon block, the p type dopant in the previously doped sections is driven further into the silicon block to provide the desired doping profile to allow formation of individual n type wells by lapping the opposing surface, as described above. For example, initially grooves are cut to a depth of about 360 µm in accordance with a desired deep doping pattern. A 160 µm deep diffusion is performed, after which 160 µm is removed (e.g., by lapping) from the surface across which the diffusion occurred. A second diffusion, of say 120 µm depth, is conducted, after which the device is completed as described above.

A still further embodiment of the method of the present invention comprises the step of implanting a p type dopant, such as Ga, on the second surface in accordance with a selected deep doping pattern. For example, Ga is implanted along an orthogonal grid pattern a few microns in thickness (e.g., 3–7 µm) with horizontal spacing corresponding to the desired pixel dimensions. The implanted dopant is then driven into the block by, e.g., diffusing the implanted dopant into the n type material by subjecting the implanted block to high temperatures in a sealed chamber, such that the implanted dopant penetrates to a depth of about 180 µm. A second dopant diffusion is then conducted uniformly across the second surface of the block (as described above) to drive the dopant initially applied further into the block and to form the p-n junction having the desired profile.

A further embodiment of the present invention is similar to the implantation method described above with the exception that the implanted p type dopant is of a first type, e.g., Al, and the second, uniformly applied dopant is of a second type, e.g., Ga; only one diffusion process is used to drive both the implanted dopant and the uniformly applied dopant into the block. The first dopant is selected so that it has a larger diffusion coefficient than the uniformly applied (second) dopant (e.g., diffusion coefficients of Al and Ga are 3×110–12 and 5×10–11 cm²/sec. at 1250° C., respectively. The larger diffusion coefficient of the implanted dopant results in it diffusing more rapidly into the block than the second, uniformly applied dopant, and thus the desired profile of the p-n junction is obtained.

The fabrication and structure of arrays of devices has been described herein; the structure and fabrication techniques are similarly applicable to the fabrication of single (typically large) semiconductor devices, e.g., having a single n type well in the block of silicon.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of forming a planar deep-diffused semiconductor device, the method comprising the step of:

doping a planar block of n type doped semiconductor material with a p type dopant in accordance with a deep doping pattern to form at least one n type wells in said block, each of said n type wells being disposed so as to respectively adjoin a first surface of said planar block and such that a respective p-n junction is formed between said n type doped semiconductor material and surrounding portions of said planar block doped with said p type dopant;

the step of doping said planar block in accordance with said deep doping pattern further comprising doping said block of semiconductor material to form a positive gradient of said p type dopant between each respective p-n junction and a second surface of said planar block such that the concentration of said p type dopant increases away from said p-n junction so that the p type dopant concentration at said second surface is higher than at said p-n junction, said second surface being disposed substantially opposite said first surface of said planar block, so as to form said planar deep-diffused semiconductor device.

2. The method of claim 1 wherein the step of doping said planar block of n type doped semiconductor material with a p type dopant comprises applying a p type dopant selected from the group consisting of gallium, boron, and aluminium into a neutron transmutation doped block of silicon.

3. The method of claim 2 wherein the step of doping said planar block in accordance with said deep doping pattern further comprises differentially doping said block of semiconductor material to different depths with said p type dopant such that said p-n junction comprises a selected p-n junction profile, said profile comprising a plurality of parallel segments and oblique segments, each of said parallel-plane segments being separated from adjacent parallel segments by an arcuate-shaped undulatory segment.

4. The method of claim 3 wherein the step of differentially doping said p type dopant further comprises the step of forming n type wefts having said selected p-n junction profile, said parallel segment being disposed substantially parallel to said second surface and said oblique segment being disposed between said parallel segment and said first surface of said block such that said p-n junction intersects said first surface at a selected angle in the finished device.

5. The method army of claim 4 wherein the fabrication of said device further comprises the step of:

removing a planar portion of said first surface to leave a remaining first surface on which portions of said p type material are exposed so as to surround the n type material exposed on said remaining first surface.

6. The method of claim 5 wherein the fabrication of said device further comprises the step of:

removing a planar portion of said second surface to leave a remaining second surface disposed a selected distance from said parallel segment of respective p-n junctions.

7. The method of claim 6 wherein the steps of removing said planar portion of said first surface and removing said planar portion of said second surface each further comprises the respective steps of mechanically removing at least a portion of the respective surface of said block and then etching the exposed surface.

8. The method of claim 6 wherein said selected distance between said remaining second surface and respective parallel segments of said p-n junctions is in the range between 10 µm and 80 µm.

9. The method of claim 6 wherein the step of differentially doping said p type dopant further comprises the steps of:

forming a plurality of grooves on said second surface of said block of n type semiconductor material; and diffusing said p type dopant into said block of n type semiconductor material across said second surface and through said grooves such that said p type dopant penetrates deeper into said block in the vicinity of said grooves, the depth of such penetration corresponding to the depth of the corresponding groove in said second surface.

10. The method of claim 4 wherein the step of differentially doping said p type dopant further comprises the step of using thermal gradient diffusion.

11. The method of claim 4 wherein the step of differentially doping further comprises the steps of:

applying a deep doping mask to said second surface of said block, said mask comprising a deep doping pattern to provide said p-n junction profile, said deep doping mask having unmasked areas of said second surface corresponding to areas of said first surface, of said block to be doped with said p type dopant in the finished device;

applying a first application of said p type dopant to said block through the open areas in said deep doping mask so as to penetrate said block with p type dopant to a selected depth;

removing said mask; and applying a second application of said p type dopant to said second surface of said block such that said p type dopant penetrates said block so as to form a foundation of p type material surrounding respective ones of said n type material wells having said selected p-n junction profile.

12. The method of claim 11 wherein the steps of applying said p type dopant each comprise diffusing said block of n type material inside a sealed chamber from a source comprising said p type dopant.

13. The method of claim 12 wherein said mask comprises silicon nitride.

14. The method of claim 12 further comprising the step of forming grooves in said second surface in a groove pattern corresponding to said deep doping pattern such that unmasked portions of said second surface are grooved.

15. The method of claim 14 wherein each of said grooves has a groove profile selected to provide a deep diffusion profile of said p type dopant.

16. The method of claim 15 wherein said groove profile comprises a groove width in a range between 5 μm and 200 μm and a groove depth in a range between 50 μm and 400 μm.

17. The method of claim 14 wherein said deep doping pattern comprises an orthogonal grid arrangement.

18. The method of claim 4 wherein the step of differentially doping further comprises the steps of:

implanting a p type dopant on said second surface in accordance with deep doping pattern to provide said selected p-n junction profile, said selected pattern further providing for implantation of p type dopant material on portions of said second surface that correspond to areas of said first surface of said block to be doped with said p type dopant in the finished device;

driving the implanted p type dopant into said n type material so as to penetrate said block with p type dopant to a selected depth; and diffusing p type dopant into said block uniformly across said second surface of said block such that said p type dopant penetrates said block so as to form a foundation of p type material surrounding respective ones of said n type material wells having said p-n junction profile.

19. The method of claim 18 wherein said deep doping pattern comprises an orthogonal grid arrangement.

20. The method of claim 4 wherein the step of differentially doping further comprises the steps of:

implanting a first p type dopant on said second surface in accordance with said deep doping pattern to provide said p-n junction profile, said deep doping pattern further providing for implantation of p type dopant material on portions of said second surface that correspond to areas of said first surface of said block to be doped with said p type dopant in the finished device; and diffusing a second p type dopant into said block uniformly across said second surface of said block such that both said first and second p type dopants penetrate said block so as to form a foundation of p type material surrounding respective ones of said n type material wells having said selected p-n junction profile.

21. The method of claim 20 wherein said first p type dopant comprises aluminum and said second p type dopant comprises gallium.

* * * * *